(12) United States Patent  
Cheng

(10) Patent No.: US 8,647,910 B2  
(45) Date of Patent: Feb. 11, 2014

(54) MASKING PASTES AND PROCESSES FOR MANUFACTURING A PARTIALLY TRANSPARENT THIN-FILM PHOTOVOLTAIC PANEL

(75) Inventor: Lap-Tak Andrew Cheng, Newark, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 19 days.

(21) Appl. No.: 13/522,035

(22) PCT Filed: Feb. 4, 2011

(86) PCT No.: PCT/US2011/023673  
§ 371 (c)(1),  
(2), (4) Date: Jul. 13, 2012

(87) PCT Pub. No.: WO2011/097430  
PCT Pub. Date: Aug. 11, 2011

(65) Prior Publication Data  
US 2013/0137210 A1 May 30, 2013

Related U.S. Application Data

(60) Provisional application No. 61/301,716, filed on Feb. 5, 2010.

(51) Int. Cl.  
*H01L 21/00* (2006.01)

(52) U.S. Cl.  
USPC .. 438/57; 438/98; 257/E25.009; 257/E21.221

(58) Field of Classification Search  
USPC .............................. 438/57, 66, 79, 96, 98, 99; 257/E25.009, E31.119, E21.221  
See application file for complete search history.

(56) References Cited

U.S. PATENT DOCUMENTS

| | | | |
|---|---|---|---|
| 4,663,495 A | 5/1987 | Berman et al. |
| 4,795,500 A | 1/1989 | Kishi et al. |
| 5,176,758 A | 1/1993 | Nath et al. |
| 5,254,179 A | 10/1993 | Ricaud et al. |
| 5,334,259 A | 8/1994 | Mizumura et al. |
| 6,180,871 B1 | 1/2001 | Campbell et al. |
| 6,320,117 B1 | 11/2001 | Campbell et al. |
| 6,509,204 B2 | 1/2003 | Campbell |

(Continued)

FOREIGN PATENT DOCUMENTS

| | | |
|---|---|---|
| EP | 1798779 A2 | 6/2007 |
| EP | 1832611 A1 | 9/2007 |

(Continued)

OTHER PUBLICATIONS

International Search Report dated Jun. 14, 2012, International Application No. PCT/US2011/023673.

*Primary Examiner* — Brook Kebede

(57) ABSTRACT

The present invention relates to masking pastes and methods for removing portions of the back electrode and photovoltaic junction from a photovoltaic laminate to create a partially transparent thin-film photovoltaic panel. Such panels may be useful in window and sun-roof applications. This method can be used to edge-delete and electrically isolate a photovoltaic panel and to reduce the reflectivity of the sun-facing substrate surface.

15 Claims, 2 Drawing Sheets

(56) References Cited

U.S. PATENT DOCUMENTS

| | | |
|---|---|---|
| 6,525,264 B2 | 2/2003 | Ouchida et al. |
| 6,858,461 B2 | 2/2005 | Oswald et al. |
| 7,098,395 B2 | 8/2006 | Hiraishi et al. |
| 2004/0219801 A1 | 11/2004 | Oswald et al. |
| 2006/0112987 A1 | 6/2006 | Nakata et al. |
| 2006/0138606 A1 | 6/2006 | De Ruiter |
| 2006/0205184 A1 | 9/2006 | Oswald et al. |
| 2010/0279458 A1* | 11/2010 | Yeh et al. ............ 438/98 |

FOREIGN PATENT DOCUMENTS

| | | |
|---|---|---|
| EP | 2276074 A2 | 1/2011 |
| GB | 2446838 A | 8/2008 |
| JP | 09082998 A * | 3/1997 |

* cited by examiner

MASKING PASTES AND PROCESSES FOR MANUFACTURING A PARTIALLY TRANSPARENT THIN-FILM PHOTOVOLTAIC PANEL

FIELD OF THE INVENTION

The present invention relates to masking pastes and methods for removing portions of the back electrode and photovoltaic junction from a photovoltaic laminate to create a partially transparent thin-film photovoltaic panel. Such panels may be useful in window and sun-roof applications. This method can be used to edge-delete and electrically isolate a photovoltaic panel, and to reduce the reflectivity of the sun-facing substrate surface of the photovoltaic panel.

BACKGROUND

A photovoltaic panel converts radiation energy into electrical energy. Of particular interest is the large-scale and cost-effective conversion of solar radiation (sunlight) into electricity using arrays of photovoltaic cells assembled into photovoltaic panels.

Thin-film photovoltaic panels are typically manufactured via a multi-step process, one stage of which is the assembly of a photovoltaic laminate on a substrate. When a transparent substrate is used for the sun-facing side of a panel, it is desirable to reduce the reflectivity of the substrate surface in order to allow more sunlight to reach the photovoltaic cell and be converted to electricity.

Photovoltaic laminates, which comprise one or more photovoltaic junctions disposed between front and back electrodes, are largely opaque to light transmission, due to the high light-absorption of the semiconductor junction and the presence of highly reflective metallic back electrode layers.

During the manufacture of photovoltaic laminates, layers of the laminate are deposited on the substrate surface, often extending to the substrate edges. The laminate is conductive, and if not removed from the substrate edges, it can lead to electrical shorts with the panel frame. The edge region is also vulnerable to environmental corrosion. Therefore it is necessary to electrically isolate the edge region of the substrate from the interior of the laminate and remove the laminate from the panel edges. Electrical isolation of a photovoltaic panel is conventionally achieved by using a laser to cut isolation grooves of a few hundred microns width through the photovoltaic laminate around the panel edges. Edge-deletion from the substrate surface at the panel periphery (e.g., from the edge to up to 1.5 cm into the substrate) can be achieved by laser or mechanical means.

Normally, light impinging on the panel can only transmit through the panel at the narrow scribe breaks where the back electrode/junction stack is divided. As a result, less than 1% of the sunlight is transmitted through the photovoltaic panel. In some applications, it is desirable to customize the degree of panel transparency and/or the light transmission pattern. For example, a significant amount of light transmission (20-50%) may be required for window or sun-roof installations. It may also be desirable to customize the color or tone of the transmitted light to match or contrast with the interior or exterior surroundings of the partially transparent photovoltaic panel.

A semi-transparent photovoltaic panel has been described in which transparent conductive oxides are used for both the front and back electrodes of the laminate. The degree of transmission can be regulated by adjusting the semiconductor band gap and thickness.

It is also known to fabricate a collection of holes or other polygonal apertures on at least the metallic back electrode to facilitate passage of light through the photovoltaic laminate. The junction layers can also be removed at the apertures to enhance light transmission. The apertures can be fabricated by photolithography using a photoresist layer.

It is also known to fabricate a translucent photovoltaic sheet on flexible stainless steel or polymer substrates. When metallic or polymer substrates are used, light must impinge from the film side of the substrate through a transparent conductive oxide (TCO) electrode on the light-facing surface of the laminate, rather than through the substrate. Small round apertures passing through the semiconductor layers and the substrate let a portion of incident light pass through. Aperture formation can be achieved by wet etching, laser drilling or mechanical perforation.

Partially transparent photovoltaic panels equipped with parallel slots cut into the opaque back electrode or electrode/junction stack have also been disclosed. A lift-off method, photolithographically defined etching, or laser drilling can be used to create the groove-shaped apertures.

Reflectivity of the sun-facing substrate surface is conventionally reduced by use of a multi-layer dielectric coating, chemical etching, or sol-gel coating methods. Typically, an anti-reflective coating is created or deposited on the substrate surface prior to the deposition of the photovoltaic laminate.

There remains a need for a method to produce partially transparent thin-film photovoltaic panels that is easy to use, cost-effective, efficient and adaptable to the specific application of the photovoltaic panels. There is also a need to streamline the separate processes required to electrically isolate, edge-delete, and reduce the reflectivity of the sun-facing side of the photovoltaic panel.

SUMMARY

One aspect of the invention is a method comprising:
(a) providing a thin-film photovoltaic panel comprising:
   (i) a substrate; and
   (ii) a photovoltaic laminate comprising a front electrode disposed on the substrate, a back electrode, and one or more photovoltaic junctions disposed between the front electrode and the back electrode;
(b) screen-printing a masking paste on the back electrode in a predetermined pattern to form a masked back electrode surface;
(c) drying the masking paste; and
(d) exposing the masked back electrode surface to an aqueous etching composition to form an etched photovoltaic laminate.

This method can be used to remove portions of the back electrode not protected by the masking paste. Portions of the photovoltaic junction disposed between the unprotected portions of the back electrode and the front electrode are also removed. This method can be used to achieve partial light transparency, electrical isolation, edge-deletion, and/or reduce the reflectivity of the sun-facing surface of the photovoltaic panels.

Another aspect of this invention is a masking paste comprising:
a) 15-40 wt % of a copolymer of methyl methacrylate and methacrylic acid;
b) 0-20 wt % phenol formaldehyde-cresol resin;
c) 0-30 wt % inorganic filler; and
d) 25-75 wt % of a high-boiling solvent.

DETAILED DESCRIPTION

Figure 1A:
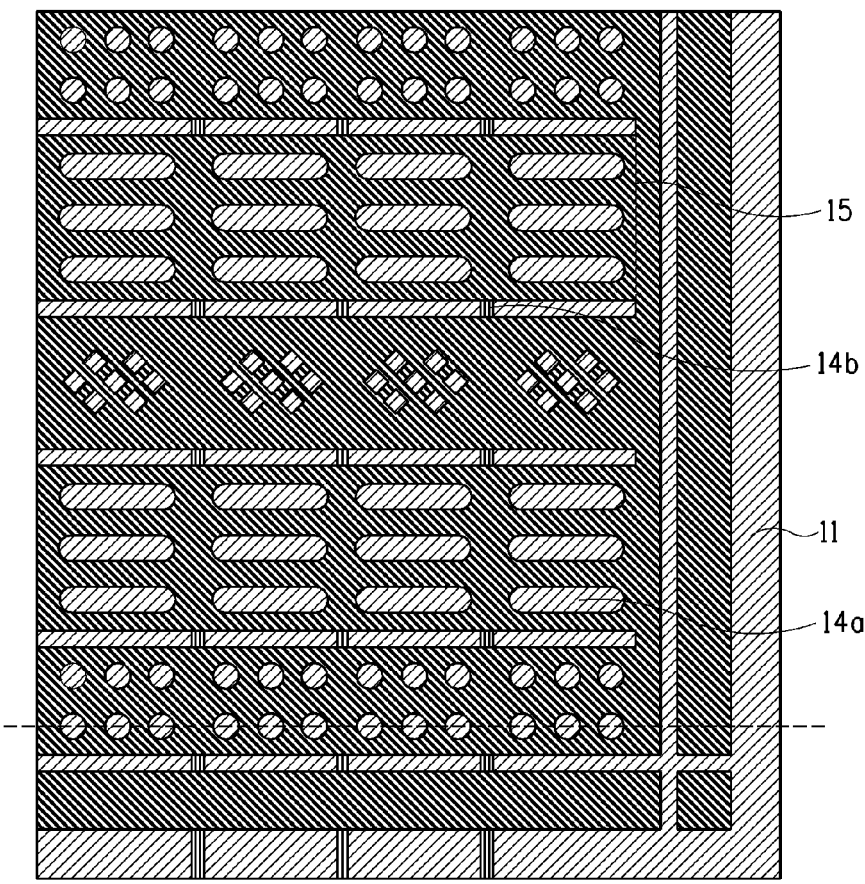
FIG. 1A is an illustration of a plan view of a thin-film photovoltaic panel after screen-printing a masking paste in a predetermined pattern.

One aspect of this invention is a method for achieving partial light transparency in a thin-film photovoltaic panel. As defined herein, "partial light transparency" means that 5-95% of the incident light is transmitted through the thin-film photovoltaic panel. This method can also be used to achieve electrical isolation and edge-deletion in some thin-film photovoltaic panels. It can also be used to reduce the reflectivity of the sun-facing surface of a thin-film photovoltaic panel.

According to the present invention, the thin-film photovoltaic panel comprises a substrate and a photovoltaic laminate having a front electrode, a photovoltaic junction, and a back electrode. The front electrode is disposed on the substrate and the photovoltaic junction is disposed between the front and back electrodes.

Glass, metal, or polymer can be employed as the substrate of the thin-film photovoltaic panel. The front electrode layer is disposed on one surface of the substrate and comprises one or more layers of metal (e.g., silver) or metal oxide (e.g., impurity-doped tin oxide, zinc oxide, or indium oxide). The back electrode comprises one or more layers of metal (e.g., silver or Ti) or metal oxide (e.g., ZnO). At least one of the front electrode and the back electrode is transparent. The photovoltaic junction comprises one or more layers of a thin-film semiconductor material. The photovoltaic junction may be a doped and/or intrinsic (i.e., undoped) semiconductor such as silicon and silicon alloys, and is disposed between the front and back electrodes.

In one embodiment, the method comprises screen-printing a masking paste onto the back electrode of the photovoltaic laminate in a predetermined pattern; drying the masking paste; and exposing the photovoltaic laminate to an aqueous etching composition to remove portions of the back electrode and the photovoltaic junction that are not protected by the mask. In some embodiments, excess etchant and/or etching by-products are removed from the surface of the photovoltaic laminate, e.g., with an aqueous rinse. In some embodiments, the dried masking paste is removed after the etching step, e.g., with an aqueous stripper composition. In some embodiments, the masking paste is left in place after etching.

The masking paste typically comprises high-boiling solvents (boiling point >180° C.), such as terpineol (1-methyl-4-(1-methylvinyl)cyclohexan-1-ol) or texanol (2,2,4-trimethyl-1,3-pentanediolmono(2-methylpropanoate)); acid-resistant polymers, such as co-polymers of methacrylic acid and methyl methacrylate, polyphenols and epoxy resins; optional thermal or photoinitiators; optional rheology modifiers, such as fumed silica or carbon black; optional acid-resistant fillers, such as graphite, $TiO_2$, alumina, or tin oxide particles; optional pigment particles; optional surfactants; and optionally monomers containing two or more reactive groups. The masking paste is formulated to provide good screen-printed fine features, long on-screen time, high etchant resistance, and ease of aqueous stripping. Masking paste compositions can also be formulated to provide features such as good environmental durability, good adhesion to the back electrode and panel encapsulant. They may be customized for color and texture.

A screen of appropriate size, tension, screen mesh, wire diameter, emulsion type, and emulsion thickness is used to print a predetermined pattern of the masking paste on the hack electrode surface of the photovoltaic laminate. The screen exhibits a pattern according to the desired percent transparency and aesthetic requirements. The pattern includes an etching pattern that can include features that define one or more isolation grooves, and edge-delete regions. The amount of light transmitted after etching the photovoltaic laminate depends on the etching pattern used and is roughly correlated with the area of the back electrode not in contact with the masking paste. In some embodiments, the pre-determined pattern of masking paste is screen-printed on 50-95%, or 60-90%), or 65-75%, and all ranges found there within of the back electrode.

There are no limits on the types of patterns used, except that the pattern must preserve the series connectivity of the photovoltaic cells on the substrate. The predetermined pattern can comprise regular geometric shapes (e.g., lines, circles, regular polygons), irregular shapes, or mixtures thereof, arrayed in any pattern.

A masking paste layer thickness of 10-50 microns is typically printed on the back electrode of the photovoltaic laminate. Paste rheology is controlled by formulation requirements such that the screen does not stick to the substrate surface, air bubbles and mesh marks release well from a wet print, and there is minimal paste reflow at rest and during drying to maintain printed fine features. To remove the high-boiling solvent from the wet print, the substrate can be heated by a hot plate, an oven, or by a heating lamp to about 100-150° C. for 5-10 minutes, or until the paste layer is dried.

After the masking paste is dried to a typical thickness of 5-25 microns, the photovoltaic laminate is physically exposed by contacting the laminate with an aqueous etching composition in the form of a bath, a spray, or a gel coating for a predetermined dwell-time that is sufficient to etch through the back electrode and the photovoltaic junction in those areas not protected by the masking paste. Optionally, the front substrate surface is concurrently exposed to an etching composition in order to reduce the reflectivity of the front substrate surface. The amount of dwell-time required depends on the concentration of the etchant and the thicknesses of the back electrode and the photovoltaic junction. Typically, less than 1 minute to 10 minutes is sufficient dwell-time. Optionally, the etching composition can be heated to reduce the required dwell-time. In one embodiment, the temperature of the etching composition is between 20° C. and 65° C. Higher temperatures may also be used, provided that the temperature does not exceed the thermal stability limits of the substrate or the etching composition.

The etching composition is typically an acidic, aqueous composition, comprising an acid such as nitric, sulfuric, hydrochloric, acetic, glycolic and/or hydrofluoric acids. The etching composition can further include fluorides (e.g., ammonium bi-fluoride) and metallic salts (e.g., silver nitrate) to improve etchant stability and durability, and acid-stable surfactants (e.g., fluorosurfactants) to improve overall etching performance. The etchant composition can be optimized for each laminate, depending on the materials used for the electrodes and semiconductor junction. The etchant composition can be further optimized to reduce the reflectivity of the front substrate surface. After etch-through, the photovoltaic laminate can be rinsed with water to wash off the etching composition and etching by-products.

In some applications, the masking paste is left in place, while in others it is removed. To remove the masking paste, the laminate is exposed to an aqueous stripper composition in the form of a bath or a spray. The aqueous stripper composition typically comprises: an alkaline salt, such as sodium carbonate; bases, such as sodium hydroxide, potassium hydroxide or tetra-ammonium hydroxide; and optionally base-stable surfactants. Typically, less than 1 to 5 minutes is sufficient dwell-time for paste removal. Optionally, the temperature of the stripper composition can be increased to reduce the required dwell-time. In one embodiment, the temperature of the aqueous stripping composition is between 20° C. and 65° C. In some embodiments, a high-pressure spray of the stripper, followed by water, is used to remove the masking paste.

In one embodiment, the front electrode is transparent fluorine-doped tin oxide (FTO), the back electrode is doped ZnO and silver, the substrate is glass and the photovoltaic junction layer is amorphous silicon. Because FTO is difficult to wet-etch, electrical isolation and edge-deletion of photovoltaic panels incorporating an FTO front electrode must be carried out in separate processes involving laser or mechanical means. The reflectivity of the substrate surface(s) can be reduced by dipping the panel in an etchant bath or spraying both sides of the panel with etchant.

Due to a high light absorption of the amorphous silicon junction layer and the highly reflective silver back electrode layer, the resulting laminate is largely opaque to light transmission. Before etching, light impinging on such a panel can only transmit through the panel at the narrow scribe breaks. Since the scribe break is typically less than 100 microns in width, only a very small percentage of sunlight (<1%) is usually transmitted through the photovoltaic panel. However, partial light transparency can be achieved as described herein by screen-printing a masking paste onto the back electrode of the photovoltaic laminate in a predetermined pattern; drying the masking paste; and exposing the photovoltaic laminate to an aqueous etching composition to remove portions of the back electrode and the photovoltaic junction.

In another embodiment, the front electrode is transparent aluminum-doped zinc oxide (AZO) the back electrode is ZnO and silver, the substrate is glass, and the photovoltaic junction layer is amorphous silicon. Since the AZO front electrode can readily be etched, electrical isolation grooves and edge-delete regions can be incorporated in the screen pattern. By exposing both sides of the panel to the aqueous etchant, the chemical etching process removes all layers of the laminate at regions not masked by the masking paste, achieving partial transparency, electrical isolation, edge-deletion, and reflectivity reduction in a single process.

In another embodiment, the front and back electrodes are doped zinc oxide (ZnO), the substrate is glass and the junction layer is amorphous silicon. A masking paste formulated with $TiO_2$ particles and epoxy resins is printed on the back electrode surface. The printed pattern contains features for an isolation groove and edge-deletion, and may also contain features for partial transparency. Thermal curing of the epoxy resin produces a white mask layer that is left in place after chemical etching. This white coating also provides a light trapping function to improve solar energy conversion efficiency. The etching process can thus achieve one or more of electrical isolation, edge-deletion, reflectivity reduction, light-trapping, and partial transparency.

In another embodiment, the front electrode is doped ZnO, the back electrode is doped ZnO and silver, the substrate is glass and the tandem photovoltaic junction layers are amorphous silicon and micro-crystalline silicon. Due to the substantially increased thickness of the photovoltaic junction layers, the masking paste is formulated with crosslinking monomers to allow for increased dwell-time for deep etching. Printed with the appropriate pattern of this masking paste, the etching process can achieve one or more of electrical isolation, edge-deletion, reduced reflectivity, and partial transparency for a tandem photovoltaic junction panel with high solar energy conversion efficiency.

In another embodiment, the front electrode is doped ZnO, the back electrode is doped ZnO and silver, the substrate is glass and the triple photovoltaic junction layers are amorphous silicon, amorphous silicon-germanium alloy, and micro-crystalline silicon. Printed with the appropriate pattern of a high-performance masking paste, the etching process can achieve one or more of electrical isolation, edge-deletion, reflectivity reduction, and partial transparency for a triple photovoltaic junction panel with very high solar energy conversion efficiency.

Figure 1B:
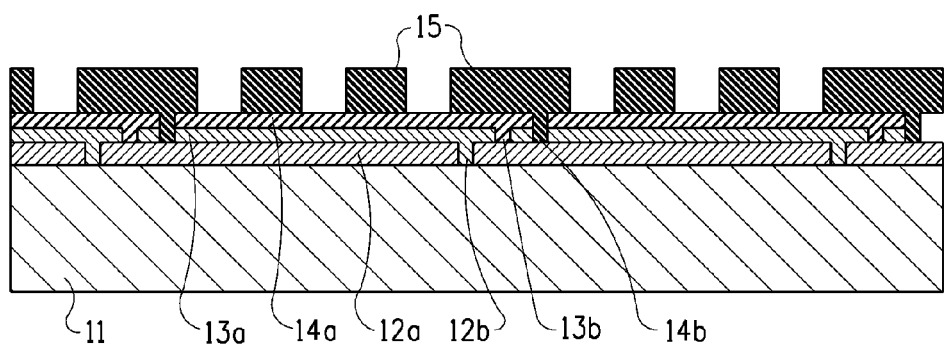
FIG. 1B is an illustration of a cross-sectional view of a thin-film photovoltaic panel after screen-printing a masking paste onto the back electrode surface.

FIG. 1A illustrates a plan view of a thin-film photovoltaic panel after screen-printing a masking paste in a predetermined pattern and FIG. 1B illustrates a cross-sectional view of a thin-film photovoltaic panel after screen-printing a masking paste 15 onto the back electrode surface. The panel comprises a substrate 11, a TCO front electrode 12a disposed on the substrate 11, and a plurality of breaks 12b to divide the TCO layer into strips of cell electrodes. Also shown is an amorphous silicon junction layer 13a that is at least partially disposed on the TCO front electrode 12a and also makes contact with the substrate through breaks 12b. The junction layer 13a is separated into regions by breaks 13b, A back electrode 14a is at least partially disposed on junction layer 13a and makes contact with the front electrode 12a through breaks 13b. Breaks 14b through the junction layer 13a and the back electrode 14a divide the panel into strips of electrical series-connected cells.

Figure 2A:
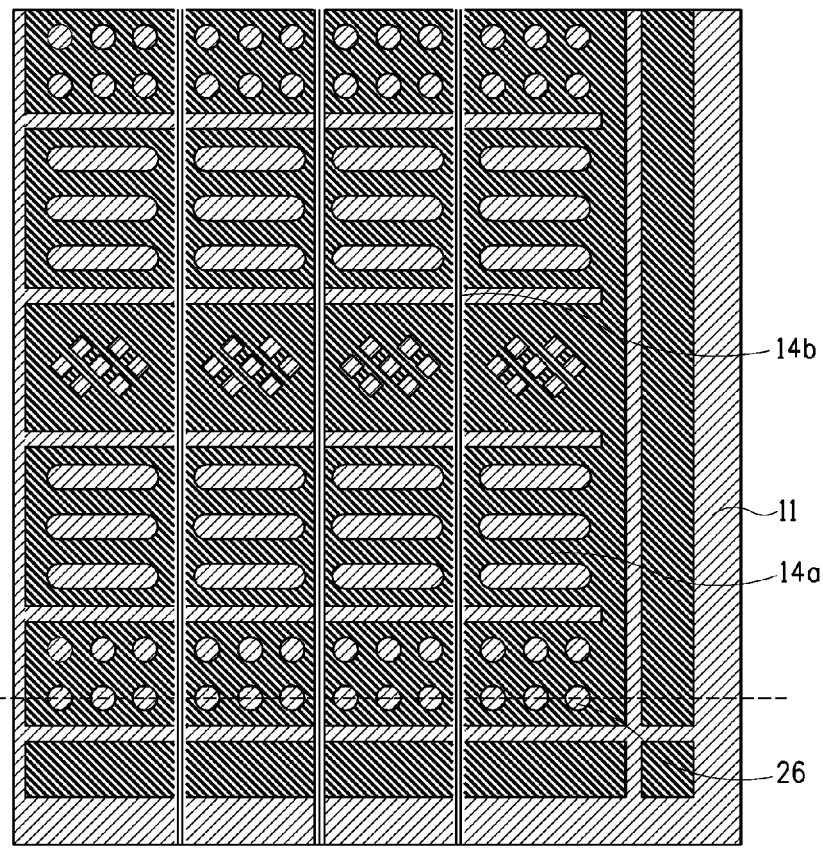
FIG. 2A is an illustration of a plan view of a thin-film photovoltaic panel after removing a portion of the back electrode and the photovoltaic junction, showing the resulting apertures in the back electrode/junction stack.

FIG. 2A is an illustration of a plan view of a thin-film photovoltaic panel after removing a portion of the back electrode and the photovoltaic junction, showing the resulting apertures 26 in the back electrode/junction stack.

Figure 2B:
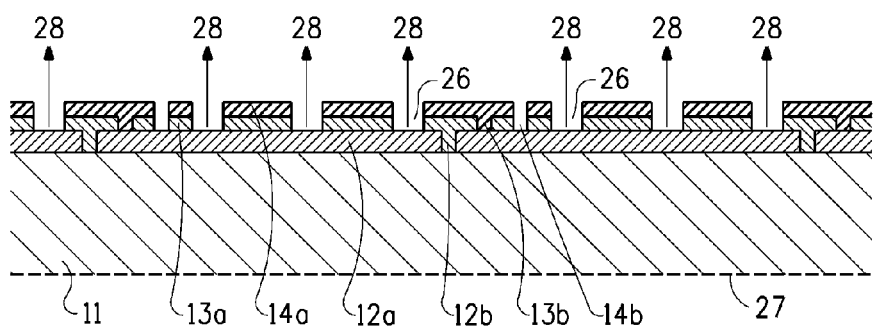
FIG. 2B is an illustration of a cross-sectional view of a thin-film photovoltaic panel after removing a portion of the back electrode and the photovoltaic junction, showing the resulting apertures in the back electrode/junction stack.

FIG. 2B is an illustration of a cross-sectional view of a thin-film photovoltaic panel after removing a portion of the back electrode and the photovoltaic junction, showing the resulting apertures 26 in the back electrode/junction stack and an anti-reflective front substrate surface 27. The etching process allows additional light 28 to be transmitted through the photovoltaic panel.

EXAMPLE

A thin-film photovoltaic panel was prepared on a glass substrate by sequential depositions of an FTO front electrode, an amorphous silicon single photovoltaic junction, and a ZnO/silver back electrode. Three laser scribing steps were used to monolithically integrate two series-connected cells on the panel. A panel sample was supplied by DuPont Apollo, a subsidiary of E. I. du Pont de Nemours and Company. As prepared, the panel had near zero transparency. An open circuit voltage of 1.7 V and a short circuit current of 45.8 mA were measured with a Newport 91159 solar simulator equipped with a filter of Air Mass 1.5 Global (AM1.5G) at an intensity of 100 mW/cm$^2$ (or 1 sun).

A masking paste was formulated by dissolving 3 g of an 80/20 copolymer of methylmethacrylate and methacrylic acid into 6 g of terpineol. Carbon black (0.5 g) was roll-milled into the copolymer solution to produce a printable masking paste.

A screen with 20% closed- and 80% open-mesh areas was prepared with 250 count stainless steel wires and a 25 micron-thick emulsion. The pattern consisted of 200, 300, and 400 micron closed-mesh lines. The masking paste was printed on the back electrode surface using a manually operated screen-printer. The wet print was allowed to rest for 10 minutes, and then dried for 10 minutes on a 135° C. hotplate.

An aqueous etchant was prepared by mixing 2 ml of 50 wt % HF, 20 ml of 70 wt % nitric acid, and 78 ml of water. The etchant was pre-heated to 60° C. The substrate coated with dried masking paste was dipped in the etchant for 1 minute, during which time the metallic back electrode and silicon junction were etched clean in areas that were not protected by the masking paste. The etched panel was rinsed in water and the masking paste was removed by dipping in an aqueous stripper consisting of 0.5 wt % sodium carbonate for 5 minutes at room temperature. The panel was rinsed in water and blow-dried with compressed air.

Light-transparent regions consisting of approximately 200, 300, and 400 micron lines were evident on the etched panel. The percent reflection of the panel was measured with a Perkin-Elmer Lambda 900 UV/VIS/NIR spectrophotometer equipped with an integrating sphere. The percent reflection was found to be reduced by 1.3% after etching. As before, an open circuit voltage of 1.7 V at one sun was measured, indicating a well-functioning etched panel. A short-circuit current of 36.5 mA was also measured, giving 79.8% of the original value for a 20% see-thru panel. This confirms that no unexplained efficiency loss was encountered as a result of the etching process.

What is claimed is:

1. A method comprising:
    (a) providing a thin-film photovoltaic panel comprising:
        (i) a substrate; and
        (ii) a photovoltaic laminate comprising a front electrode disposed on the substrate, a back electrode, and one or more photovoltaic junction disposed between the front electrode and the back electrode;
    (b) screen-printing a masking paste on the back electrode in a predetermined pattern to form a masked back electrode surface;
    (c) drying the masking paste; and
    (d) exposing the photovoltaic laminate to an aqueous etching composition to form an etched photovoltaic laminate.

2. The method according to claim 1, wherein the etching composition comprises at least two acids selected from the group consisting of nitric acid, hydrochloric acid, and hydrofluoric acid.

3. The method according to claim 1, further comprising heating the etching composition.

4. The method according to claim 1, wherein the front electrode layer is transparent.

5. The method according to claim 1, wherein the back electrode layer is transparent.

6. The method according to claim 1, wherein the masking paste comprises 15-40 wt % of a copolymer of methyl methacrylate and methacrylic acid, 0-20 wt % phenolformaldehyde-cresol resin, 0-30 wt % inorganic filler, and 25-75 wt % of a high-boiling solvent.

7. The method according to claim 6, wherein the inorganic filler is selected from the group consisting of carbon black, graphite, and tin oxide.

8. The method according to claim 6, wherein the high-boiling solvent is 1-methyl-4-(1-methylvinyl)cyclohexan-1-ol or 2,2,4-trimethyl-1,3-pentanediolmono(2-methylpropanoate).

9. The method according to claim 1, wherein the dried masking paste is removed by exposing the photovoltaic panel to an aqueous solution comprising a base selected from the group consisting of sodium carbonate, sodium hydroxide, potassium hydroxide and tetra-ammonium hydroxide.

10. The method according to claim 1, further comprising:
    (e) rinsing the etched photovoltaic laminate with water.

11. The method according to claim 1, further comprising exposing the substrate to an aqueous etching composition.

12. The method according to claim 1, further comprising exposing the etched photovoltaic laminate to an aqueous stripper composition.

13. The method of claim 12, wherein the aqueous stripper composition comprises an alkaline salt and a base selected from the group consisting of sodium hydroxide, potassium hydroxide, and tetra-ammonium hydroxide.

14. The method of claim 1 wherein the etching composition remains on the laminate for a predetermined dwell-time sufficient to etch through the back electrode and the photovoltaic junction.

15. A masking paste comprising:
    a) 15-40 wt % of a copolymer of methyl methacrylate and methacrylic acid;
    b) 0-20 wt % phenolformaldehyde-cresol resin;
    c) 0-30 wt % inorganic filler; and
    d) 25-75 wt % of a high-boiling solvent.

* * * * *